United States Patent [19]

Wilson, Jr.

[11] 4,255,721
[45] Mar. 10, 1981

[54] TEMPERATURE COMPENSATED INTEGRATABLE RC OSCILLATOR

[75] Inventor: Thomas G. Wilson, Jr., Morristown, N.J.

[73] Assignee: Bell Telephone Laboratories, Incorporated, Murray Hill, N.J.

[21] Appl. No.: 974,383

[22] Filed: Dec. 29, 1978

[51] Int. Cl.³ ............................................. H03K 3/295
[52] U.S. Cl. .................................... 331/111; 331/109; 331/176; 331/186
[58] Field of Search ............... 331/108 C, 108 D, 111, 331/143, 109, 176, 113 R, 183, 186

[56] References Cited

U.S. PATENT DOCUMENTS

| 3,824,494 | 7/1974 | Wilcox | 331/177 R X |
| 3,916,342 | 10/1975 | Higuchi et al. | 331/111 |

Primary Examiner—Siegfried H. Grimm
Attorney, Agent, or Firm—Robert O. Nimtz

[57] ABSTRACT

A high stability integratable resistance-capacitance oscillator is disclosed which is capable of operating at a stable frequency regardless of changes in ambient temperature or applied voltages. The oscillator uses a temperature compensating impedance and semiconductor junction to compensate for temperature dependent variations in active elements of the oscillator. Constant current bias sources and voltage clamping circuits insure oscillations having predetermined amplitude ranges despite changes in applied voltages. Active transistors in the oscillator are maintained in their linear range by the use of antisaturation transistors connected between their base and collector electrodes.

10 Claims, 4 Drawing Figures

TEMPERATURE COMPENSATED INTEGRATABLE RC OSCILLATOR

BACKGROUND OF THE INVENTION

1. Field of the Invention

This invention relates to resistive-capacitive oscillators and, more particularly, to integrated RC oscillators for generating high frequency oscillations with 0.5 percent stable frequency characteristics.

2. Description of the Prior Art

In many applications such as, for example, the driving oscillator in DC-to-DC converter circuits, it is desirable to generate relatively high oscillation frequencies in order to reduce the size of transformers used in such systems. For applications as subscriber loop carrier systems in which cost, size and power consumption of the converter are of particular importance, it is also desirable to fabricate such oscillators in integrated circuit form. Present technology, however, dictates that integrated oscillators be of the resistance-capacitance type since inductive elements cannot be fabricated in integrated form.

A significant problem with integrated RC oscillators is the tendency of the frequency to drift with changes in temperature of a change in the supply voltages. In applications such as subscriber loop carrier systems where the oscillator frequency might generate frequency components which interface with signal frequencies, such frequency shifts cannot be tolerated.

SUMMARY OF THE INVENTION

In accordance with the illustrative embodiment of the present invention, as integrated resistive-capacitive oscillator is provided in which frequency stabilization is accomplished by making the oscillator voltages swings independent of applied voltages. This is accomplished by providing constant current bias supply for the active oscillator elements and by clamping both extremes of the oscillator output voltage to predetermined fixed potentials. In addition, temperature compensation in the form of a compensating impedance and a compensating PN junction are provided at the oscillator control input to further insure frequency stability.

The major advantage of integrated RC oscillators employing the principles of the present invention is the ability to generate high frequency oscillations having a stable frequency characteristic despite their reliance on resistive and capacitive frequency-determining elements. When fabricated in integrated circuit form, such oscillators also are small, inexpensive and consume little power.

DETAILED DESCRIPTION

Figure 1:
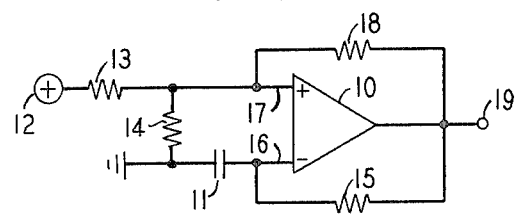
FIG. 1 is a general block diagram of a resistive-capacitive oscillator utilizing an operational amplifier and which would profitably benefit from the frequency stabilizing arrangements in accordance with the present invention.

Referring more particularly to FIG. 1, there is shown an RC oscillator circuit comprising a differential amplifier 10 having a capacitor 11 connected between input 16 and ground potential. A fixed voltage supplied from voltage source 12 across a voltage divider including resistors 13 and 14 presents a constant voltage to the input 17 of differential amplifier 10. A feedback resistor 15 is connected from the output of amplifier 10 to the capacitive input 16, while a second feedback resistor 18 is connected from the output of amplifier 10 to the constant voltage input 17.

The operation of the oscillator of FIG. 1 is as follows. Assuming the output of amplifier 10 is in a high voltage state, capacitor 11 is charged through resistor 15 until the voltage at input 16 of amplifier 10 exceeds the voltage at input 17. At this time, differential amplifier 10 changes state and produces a low output voltage at its output terminal 19. Capacitor 11 discharges toward this low voltage while, at the same time, the voltage at input terminal 17 decreases to a lower threshold value due to the loss of the voltage across resistor 14 caused by feedback current through resistor 18. When the voltage at input terminal 16 falls below the lowered threshold at input terminal 17, amplifier 10 again goes into its high output voltage state. The threshold voltage at input terminal 17 therefore increases due to the added voltage drop caused by the feedback current and capacitor 11 begins to charge toward this higher voltage through resistor 15.

The oscillator circuit of FIG. 1 will continue to oscillate in the above-described fashion as long as it is supplied by an operating voltage from source 12. The frequency of oscillation is determined in the first instance by the values of capacitor 11 and resistor 15. This frequency of oscillation, however, is also affected by the voltage biases supplied to amplifier 10 which determine the output voltage levels in the two states. Similarly, the frequency of oscillation is in part determined by the value of voltage supply 12 since this sets the threshold voltage at input 17. Finally, the frequency of the oscillator of FIG. 1 is in part determined by the temperature of the components making up amplifier 10. At low frequencies the effect of these various environmental parameters on the frequency of oscillation can be ignored since the percentage change in frequency is small. For higher frequency oscillators, however, the frequency changes represent a significant deviation from the nominal frequency and in many applications cannot be tolerated.

Figure 2:
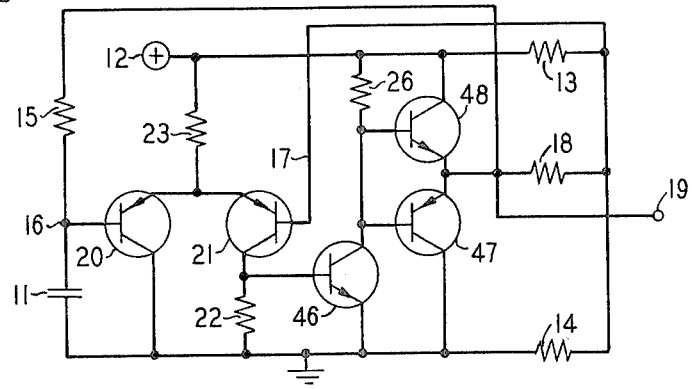
FIG. 2 is a more detailed circuit diagram of the RC oscillator shown in FIG. 1.

In FIG. 2 there is shown a more detailed circuit diagram of the RC oscillator shown in FIG. 1, and the corresponding components have the same reference numerals as those used in FIG. 1. In FIG. 2 the differential amplifier 10 comprises a differential pair of transistors 20 and 21 having their emitters connected together. Resistor 23 provides emitter bias for transistors 20 and 21. Transistors 20 and 21 comprise a differential pair having a reference input at lead 17 and a varying input at lead 16. The output 19 is taken from the common emitter connection of transistors 48 and 47.

The circuit of FIG. 2 operates in precisely the manner described in connection with FIG. 1. Output terminal 19 is in a high voltage state when transistor 20 is fully conducting and transistor 21 is fully cut off. When transistor 20 is cut off and transistor 21 is on, the output voltage at terminal 19 is near zero potential. Output terminal 19 goes to the high state when the voltage at lead 16 falls sufficiently low to forward bias the emitter-base junction of transistor 20. The voltage at lead 17 is then higher than the voltage at lead 16 and the voltage on lead 16 therefore rises toward the higher voltage, eventually to reverse bias the base-emitter junction in transistor 20. Transistor 20 therefore turns off, and transistor 21 turns on. When transistor 21 turns on, current flows through resistor 22 and transistor 46 is also turned on. When transistor 46 turns on, the output voltage 19 assumes its low state, thus providing a sharp demarcation between the high and low states.

Figure 3:
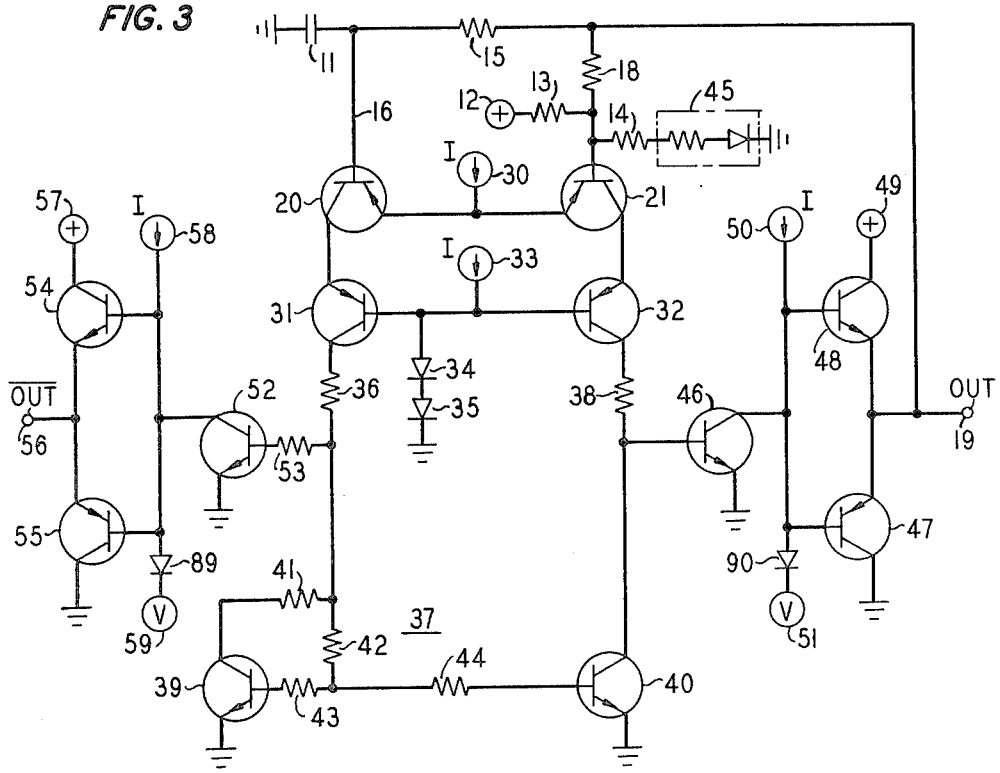
FIG. 3 is a circuit diagram of a frequency stabilized RC oscillator in accordance with the present invention in which the frequency stabilizing elements are shown in functional form.

Referring to FIG. 3, there is shown a detailed circuit diagram of an RC oscillator of the form shown in FIG. 2, but including frequency stabilizing arrangements in accordance with the present invention and suitable for fabrication in integrated circuit form. Again, corresponding components in FIG. 3 have been identified with the same reference numerals as in FIGS. 1 and 2. Thus, transistors 20 and 21 comprise the primary active elements of a differential pair. Rather than being biased at their emitter electrodes by a resistor, they are biased from a constant current source 30 which delivers a constant current to the emitters of transistors 20 and 21 independent of the precise value of the supply voltage. Since the collector electrodes of transistors 20 and 21 have a high output impedance (and hence susceptible to parasitic capacitive effects) a pair of isolating transistors 31 and 32 are connected to these collector circuits. Transistors 31 and 32 are connected in the common base configuration to afford a low impedance load for transistors 20 and 21, respectively.

The bases of transistors 31 and 32 are biased by a constant voltage, developed by the voltage drop across the forward biased junctions of diodes 34 and 35 from current source 33. The collector of transistor 31 is connected through a resistor 36 to a compound impedance 37 while the collector of transistor 32 is connected through a resistor 38 to impedance 37. Impedance 37 includes two transistors, 39 and 40, together with resistors 41, 42, 43 and 44 to provide a highly stable active load for the differential pair. The voltage drop across resistor 41 is split by resistors 42 and 44 to provide a base signal through resistor 43 to transistor 39 such that the turn-on threshold of transistors 39 and 52 is relatively independent of the applied current levels. The same signal is, of course, applied through resistor 44 to the base of transistor 40 to control the turn-on threshold of transistor 46. The combined common impedance 37 for the differential pair therefore maintains the turn-on threshold of transistors 52, and 46 at a relatively constant value regardless of applied current levels and thus contributes to the frequency stability of the overall combination.

A temperature compensating impedance 45 is connected in series with resistor 14 between the base electrode of transistor 21 and ground potential. Impedance 45 includes a resistive component which compensates for temperature-dependent variations in the collector-emitter path of output transistor 46. Impedance 45 also includes a forward-biased semiconductor junction which compensates for temperature variations in the base-emitter path of output transistor 47. Compensation takes place by forcing variations in the input to transistor 21 to track the variations of the output 19, substantially compensating for the temperature variations of transistors 46 and 47. The output of the differential amplifier is applied through transistor 46, the base of which is connected between resistor 38 and transistor 40. The collector of transistor 46, in turn, drives a complementary pair of transistors 47 and 48, biased from voltage source 49. The bases of transistors 47 and 48 are biased from a constant current source 50 and clamped to a constant voltage source 51 through diode 90 to insure that the voltage at output terminal 19 in the high state is of a preselected and fixed value when transistor 46 is in the OFF condition. That is, transistor 40 is controlled by the combination of current source 50 and voltage source 51 such that the output voltage at terminal 19 is at the voltage of source 51 (less the fixed base-emitter voltage drop of transistor 48) when transistor 48 is conducting. The impedance of the emitter-collector path of transistor 48 is therefore controlled to compensate for variations in source 49. When transistor 46 is in the ON condition, the output at terminal 19 is clamped near ground potential offset by the collector-emitter voltage of transistor 47. It can thus be seen that the output voltage at terminal 19 swings between this offset potential and a fixed voltage independent of the supply voltages. The output voltage at terminal 19 is fed back through resistors 18 and 15 to provide the control potential for transistors 20 and 21 as described in connection with FIGS. 1 and 2.

In order to provide an inverted output from the oscillator of FIG. 3, a transistor 52 has its base electrode connected through resistor 53 to the midpoint of resistors 36 and 41. A collector of transistor 52 is connected to the base electrodes of a pair of complementary transistors 54 and 55, the common emitter connection of which provides an inverted output terminal 56. A supply for transistors 54 and 55 is provided by voltage source 57. The bases of transistors 54 and 55 are biased from a constant current source 58 and clamped through diode 89 to constant voltage source 59 so as to operate in the same manner as output transistors 47 and 48. That is, transistors 54 and 55 provide a voltage swing between a potential offset from ground by the collector-emitter drop of transistor 55 and a predetermined and fixed high voltage. These voltages are, of course, at any particular instant of time the inverse of the voltages supplied at output terminal 19.

Figure 4:
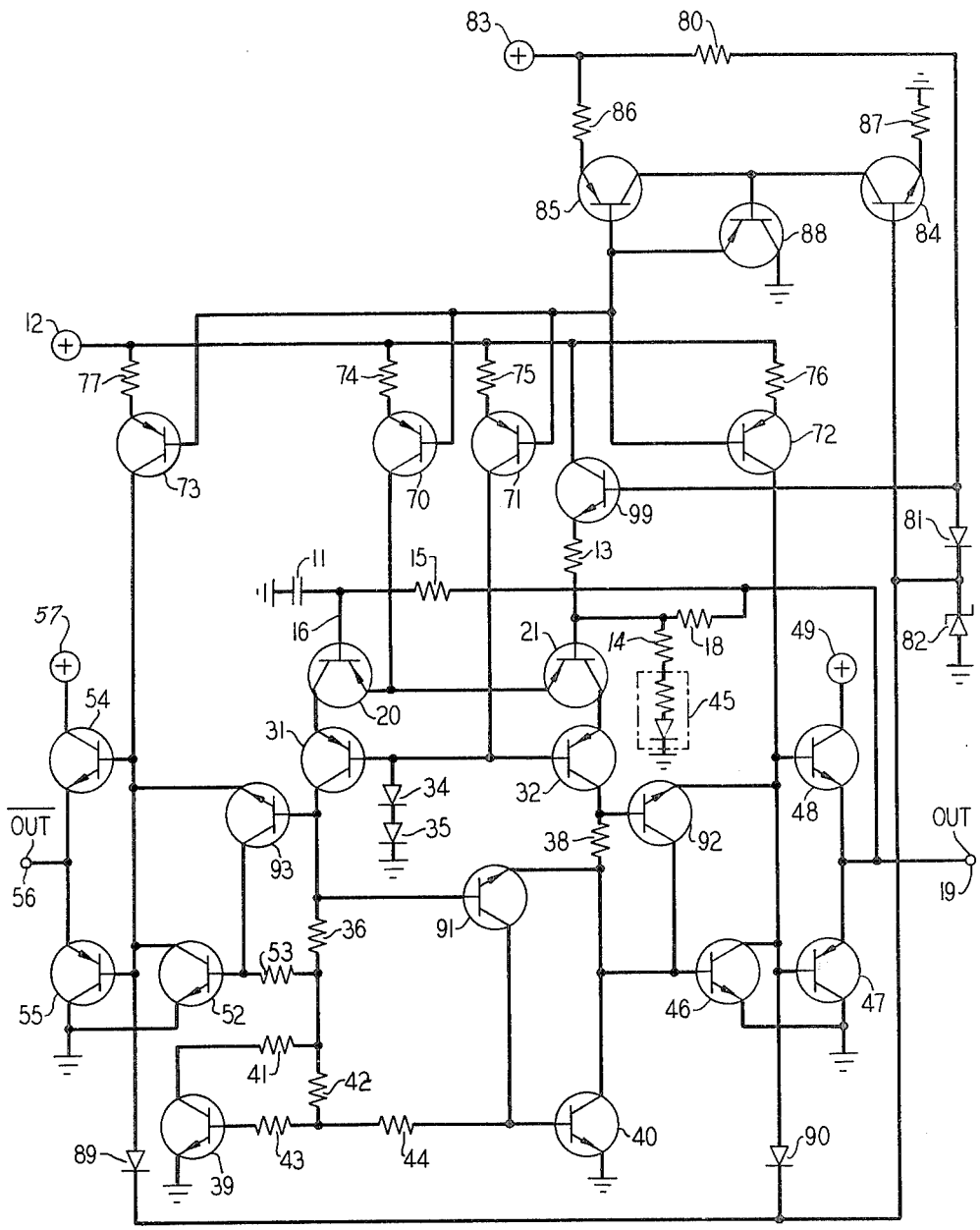
FIG. 4 is a complete detailed circuit diagram of the stabilized RC oscillator circuit shown in FIG. 3.

Referring more particularly to FIG. 4, there is shown a complete detailed circuit diagram of a frequency stabilized RC oscillator as shown in general form in FIG. 3. In FIG. 4 components corresponding to those shown in FIG. 3 are identified by the same reference numerals. The operation of the circuit of FIG. 4 is precisely that described in connection with FIG. 3. The constant current sources 30, 33, 50 and 58 are provided by transistors 70, 71, 72 and 73, respectively. A control current to the bases of transistors 70 through 73 insures that a constant current is delivered to the collectors of these transistors. The magnitude of this current is determined by the emitter resistors 74, 75, 76 and 77, respectively, connected to voltage source 12. This control current is derived from a circuit including a resistor 80, a diode 81 and a zener diode 82 connected in series between voltage source 83 and ground potential. The constant voltage derived across zener diode 82 is applied to the base of transistor 84. Transistor 84 develops a control current in its collector-emitter path, the value of which is determined by the voltage across diode 82 applied across resistor 87 in series with the base-emitter path of transistor 84. This control signal is drawn through the collector-emitter path of transistor 85 and, through a current mirror effect, to set the current, through transistors 70, 71, 72 and 73. Transistor 85 provides a shunt path for the base currents of transistors 70, 71, 72, 73 and 85 to prevent its addition to the controlled current in the collector-emitter path of transistor 84.

The voltage drop across zener diode 82 is also used as a voltage clamp through diodes 89 and 90 to clamp the bases of transistors 47, 48, 54 and 55 to the zener breakdown voltage when the driving transistors 46 and 52 are in their respective OFF states. Transistor 99, operated from the mid point of resistor 80 and diode 81, provides a controlled current to resistor 13.

In order to further assure the linear operation of the oscillator of FIG. 4, antisaturation transistors are connected across the base-collector paths of transistors 40, 46 and 52. Thus, for example, transistors 91 has its collector-emitter path connected in parallel with the base-collector path of transistor 40. Transistor 91 is driven by the voltage at the collector of transistor 31 and shunts excessive base current of transistor 40 to its collector electrodes, thus forcing transistor 40 to operate in its linear non saturated range. Transistor 92 affords a similar function for transistor 46 while transistor 93 affords a similar function for transistor 52.

The circuit of FIG. 4 therefore provides a stable RC oscillator, the frequency of which remains stable despite changes in the supply voltages or in the ambient temperature. The oscillator of FIG. 4 is sufficiently stable so that controlled oscillations can occur at frequencies as high as 100 kilocycles without significant frequency drift (e.g., less than one percent). This capability is particularly important in integrated circuit oscillators which must rely on resistive-capacitive elements for frequency determination and yet must be stable in frequency at relatively high frequencies.

I claim:

1. A frequency stabilized oscillator for producing a square wave output and using only resistance and capacitance frequency-determining elements
    CHARACTERIZED BY
        a constant voltage source,
        a constant current supply,
        an output stage comprising at least one transistor providing said output at its emitter electrode and receiving an oscillatory input signal,
        means for clamping the base of said transistor to said constant voltage source and biasing said base from said constant current supply so as to maintain the emitter voltage of said transistor constant during one half-cycle of each oscillation, and
        means for clamping said emitter to a voltage with a fixed offset from ground potential during the other half-cycle of each oscillation.

2. The frequency stabilized oscillator according to claim 1 further
    CHARACTERIZED BY
        at least one other transistor connected to said output stage of said oscillator so as to drive said output stage and having its collector-emitter path controlled by signals at its base electrode, and
        an antisaturation transistor having its collector-emitter path connected in parallel with the base-collector path of said at least one other transistor, the base of said antisaturation transistor being controlled by the same signal as the base of said one other transistor.

3. The frequency stabilized oscillator according to claim 1 further
    CHARACTERIZED BY
        a temperature compensating resistor,
        a temperature compensating semiconductor junction, and
        means for connecting said resistor and said semiconductor junction in series between an input to said frequency stabilized oscillator and ground potential to provide a temperature compensating offset potential.

4. The frequency stabilized oscillator according to claim 1 further
    CHARACTERIZED BY
        at least one other constant current bias supply, connected to said frequency stabilized oscillator for supplying constant current independent of the precise value of a supply voltage for said oscillator,
        a zener diode connected between ground potential and said supply voltage, and
        means utilizing said zener diode for controlling said other constant current bias supply.

5. The frequency stabilized oscillator according to claim 4
    CHARACTERIZED IN THAT
        said zener diode also comprises said constant voltage source.

6. A resistive-capacitive oscillator including
    a differential amplifier,
    a capacitor connected between one input of said amplifier and ground potential,
    a resistive voltage divider connected between a voltage source and ground potential, having the midpoint of said voltage divider connected to the other input to said amplifier,
    first resistive feedback means connected from the output of said amplifier to said capacitor, and
    second resistive feedback means connected from the output of said amplifier to said voltage divider, said oscillator
    CHARACTERIZED BY
        a constant voltage source,
        a constant current source,
        an output stage including at least one transistor, and
        means for clamping the base of said transistor to said constant voltage source and biasing said base from said constant current source.

7. The resistive-capacitive oscillator according to claim 6
    CHARACTERIZED BY
        means for supplying bias currents to said differential amplifier from said constant current source.

8. The resistive-capacitive oscillator according to claim 6
    CHARACTERIZED IN THAT
        said amplifier comprises a plurality of transistors to drive the output stage of said oscillator, and
        an antisaturation transistor for each of said plurality of transistors, each of said antisaturation transistors having its collector-emitter path connected in parallel with the base-collector path of said plurality of transistors.

9. The resistive-capacitive oscillator according to claim 6

CHARACTERIZED BY a temperature compensating resistor, a temperature compensating diode, and means for connecting said resistor and said diode in series with said voltage divider.

10. The resistive-capacitive oscillator according to claim 7 further
CHARACTERIZED IN THAT
said constant current source comprises
a zener diode, and
a transistor constant current source controlled by the voltage across said zener diode.

* * * * *

UNITED STATES PATENT AND TRADEMARK OFFICE
CERTIFICATE OF CORRECTION

PATENT NO. : 4,255,721

DATED : March 10, 1981

INVENTOR(S) : Thomas G. Wilson, Jr.

It is certified that error appears in the above—identified patent and that said Letters Patent is hereby corrected as shown below:

Column 1, line 17 "applications as" should read --applications such as--.
Column 1, line 27 "of" should read --or--.
Column 1, line 30 "interface" should read --interfere--.
Column 1, line 37 "voltages" should read --voltage--.
Column 5, line 17 "transistors 91" should read --transistor 91--.
Column 5, line 22 "electrodes" should read --electrode--.

Signed and Sealed this

Sixth Day of October 1981

[SEAL]

Attest:

GERALD J. MOSSINGHOFF

Attesting Officer   Commissioner of Patents and Trademarks